United States Patent
Bou-Ghazale et al.

(10) Patent No.: US 10,268,122 B2
(45) Date of Patent: Apr. 23, 2019

(54) TECHNIQUES TO ACHIEVE AREA REDUCTION THROUGH CO-OPTIMIZING LOGIC CORE BLOCKS AND MEMORY REDUNDANCIES

(71) Applicant: INTEL CORPORATION, Santa Clara, CA (US)

(72) Inventors: Silvio E. Bou-Ghazale, Hillsboro, OR (US); Abhik Ghosh, Beaverton, OR (US); Niti Goel, Portland, OR (US)

(73) Assignee: Intel Corporation, Santa Clara, CA (US)

(*) Notice: Subject to any disclaimer, the term of this patent is extended or adjusted under 35 U.S.C. 154(b) by 123 days.

(21) Appl. No.: 15/124,810

(22) PCT Filed: Jul. 8, 2014

(86) PCT No.: PCT/US2014/045779
§ 371 (c)(1),
(2) Date: Sep. 9, 2016

(87) PCT Pub. No.: WO2016/007140
PCT Pub. Date: Jan. 14, 2016

(65) Prior Publication Data
US 2017/0023863 A1    Jan. 26, 2017

(51) Int. Cl.
*G03F 7/20* (2006.01)
*G11C 5/02* (2006.01)
(Continued)

(52) U.S. Cl.
CPC .......... *G03F 7/705* (2013.01); *G06F 11/2041* (2013.01); *G06F 17/5081* (2013.01);
(Continued)

(58) Field of Classification Search
CPC .. G03F 7/705; G06F 17/5081; G06F 17/5068; G06F 11/2041; G11C 5/025; G11C 29/816; G11C 29/702; G11C 29/88
See application file for complete search history.

(56) References Cited

U.S. PATENT DOCUMENTS 5,828,578 A    10/1998  Blomgren
5,907,511 A *  5/1999  Crafts .................. G11C 29/848
                                              365/191
(Continued)

FOREIGN PATENT DOCUMENTS

EP    1185985 A1    3/2002
JP    H07191908 A    7/1995
(Continued)

OTHER PUBLICATIONS

Stroud, et al., "Recovering Faulty Processing Elements to Enhance Reliability and Lifecycle in VLSI Processor Arrays," 2001 IEEE Autotestcon Proceedings: IEEE Systems Readiness Technology Conference, vol. 37, Aug. 20, 2001. pp. 524-530.
(Continued)

*Primary Examiner* — Naum Levin
(74) *Attorney, Agent, or Firm* — Finch & Maloney PLLC

(57) ABSTRACT

Techniques are disclosed for achieving size reduction of embedded memory arrays through determining a spare-core layout. In an embodiment, input parameters comprising global process parameters are combined with design characteristics to compute yield values corresponding to potential redundancy configurations for a die. Resulting yields may be compared to determine which redundancy configuration is suitable to maintain a particular yield. A die configured with one or more spare cores (with no redundant memory therein) results in a yield which is equivalent to, or exceeds, the yield of a die with conventional memory redundancies. In some example cases, memory redundancy (Continued)

is eliminated from cores. Another embodiment provides a semiconductor structure having including an array of redundant cores, each including a composition of memory arrays and logic structures, wherein at least one of the memory arrays of each redundant core is implemented without at least one of row redundancy and column redundancy.

8 Claims, 7 Drawing Sheets

(51) Int. Cl.
    *G11C 29/00*     (2006.01)
    *G06F 17/50*     (2006.01)
    *G06F 11/20*     (2006.01)

(52) U.S. Cl.
    CPC ............ *G11C 5/025* (2013.01); *G11C 29/702* (2013.01); *G11C 29/814* (2013.01); *G11C 29/816* (2013.01); *G11C 29/88* (2013.01); *G06F 17/5068* (2013.01)

(56) References Cited

U.S. PATENT DOCUMENTS

| | | | | |
|---|---|---|---|---|
| 6,922,798 | B2* | 7/2005 | Nemani | G11C 29/808 714/710 |
| 7,890,900 | B2* | 2/2011 | Aleksanyan | G11C 29/812 702/81 |
| 8,359,553 | B1* | 1/2013 | Aleksanyan | G11C 29/812 716/112 |
| 2006/0212677 | A1 | 9/2006 | Fossum | |
| 2008/0178127 | A1* | 7/2008 | Dewkett | G06F 17/5045 716/132 |
| 2010/0050135 | A1 | 2/2010 | Aleksanyan et al. | |
| 2014/0082453 | A1 | 3/2014 | Sikdar et al. | |

FOREIGN PATENT DOCUMENTS

| | | |
|---|---|---|
| JP | 2005208961 A | 8/2005 |
| WO | 2016007140 A1 | 1/2016 |

OTHER PUBLICATIONS

Choi, et al., "Fault Tolerant Memory Design for HW/SW Co-Reliability in Massively Parallel Computing Systems," Proceedings of the Second IEEE International Symposium on Network Computing and Applications (NCA' 03), Apr. 2003. 8 Pages.

Makar, et al., "Testing of Vega2, a Chip Multi-Processor with Spare Processors," International Test Conference, IEEE, 2007. pp. 1-10.

Extended European Search Report received for EP Application No. 14897113.8, dated Feb. 2, 2018. 12 pages.

Zhang, et al., "On Topology Reconfiguration for Defect-Tolerant NoC-Based Homogeneous Manycore Sytems," IEEE Transactions on Very Large Scale Integration (VLSI) Systems, vol. 17, No. 9, Sep. 2009. pp. 1173-1186.

JP Office Action received for JP Application No. 2016-569417 dated Apr. 3, 2018. 5 pages.

International Search Report and Written Opinion received for PCT/US2014/045779. dated Feb. 25, 2015. 12 pages.

Taiwan Office Action and Search Report received for TW Application No. 104117637, dated Oct. 27, 2016. 12 pages.

Shamshiri, et al., "Modeling Yield, Cost, and Quality of a Spare-Enhanced Mulitcore Chip," IEEE Transactions on Computers, vol. 60, No. 9, Sep. 2011. pp. 1246-1259.

Zhang, et al., "Defect Tolerance in Homogeneous Manycore Processors Using Core-Level Redundancy with Unified Topology," In: Design, Automation and Test in Europe: IEEE, Mar. 10, 2008. 6 pages.

International Preliminary Report on Patentability received for PCT/US2014/045779. dated Jan. 19, 2017. 9 pages.

\* cited by examiner

Fig. 3a

| | Global Process Parameters (Defect Density - Defects/cm^2) | | | |
|---|---|---|---|---|
| | No Redundancy | Row Redundancy | Column Redundancy | Row and Column Redundancy |
| Logic | 0.16 | | | |
| RAM | 0.5 | 0.35 | 0.35 | 0.2 |
| RF | 0.33 | 0.28 | 0.28 | 0.2 |

Fig. 3b

| | | Design Parameters - Logic and RAM sizes, Compositions expressed as Area Percentages, and redundancy | | | | | |
|---|---|---|---|---|---|---|---|
| | | | Area Percentage of Region | Logic and RAM Composition as an Area percentage of Sub-Array | | | Area of Region (cm^2) |
| | Subcomponent | | | No Row or Column Redundancy | Row Redundancy | Column Redundancy | Row and Column Redundancy |
| Shell Region | Logic | Address, Decode, Output Logic | 28% | 0% | 0% | 0% | 0% | 0.9 |
| | RAM | Address, Decode, Output Logic | 28% | 0% | 0% | 0% | 100% | |
| | | Array | | | | | | |
| | RF | Address, Decode, Output Logic | 9% | 0% | 0% | 0% | 100% | |
| | | Array | | | | | | |
| Single Core Region | Logic | Address, Decode, Output Logic | 28% | 0% | 0% | 0% | 0% | 0.002 |
| | RAM | Address, Decode, Output Logic | 28% | 0% | 0% | 0% | 100% | |
| | | Array | | | | | | |
| | RF | Address, Decode, Output Logic | 8% | 0% | 0% | 0% | 100% | |
| | | Array | | | | | | |

Baseline Yield Results

| | | Area of Region (cm^2) | Number of Instantiations | Number of Spare Cores | Combinations | Single Occurrence Defects per Subcomponent | Single-Instance Yield | Yield with Redundancy PDF | Yield with Redundancy CDF | Total Relative Yield |
|---|---|---|---|---|---|---|---|---|---|---|
| Shell Region | Logic | 0.9 | 1 | 0 | 1 | 0.00049 | 0.855661864 | | 0.8406633 | 0.7152298 |
| | RAM | | | | | 0.0004 | | | 0.9866682 | 0.8440289 |
| | RF | | | | | 0.009 | | | 0.9932238 | 0.855301 |
| Single Core Region | Logic | 0.0002 | 500 | 0 | 1 | 0.00021 | 0.655956146 | 0.8406633 | 0.999965 | 0.8556694 |
| | RAM | | | 1 | 500 | 0.000184 | | 0.1498699 | | 0.8556661 |
| | RF | | | 2 | 124750 | 0.000032 | | 0.0126946 | | |
| | | | | 3 | 20705500 | | | 0.0003729 | | |
| | | | | 4 | 2573031125 | | | 3.15E-05 | | |

Fig. 3c

Total Yield — Yields for Redundant Core Region — Non-Redundant Yields — Weighted Defect Probabilities

Fig. 3d (Annotations: Total Yields; Yields for Redundant Core Region; Non-Redundant Yields; Weighted Sum of Defect Density)

Two-Dimensional
Yield Comparisons

| At the Redundant Single Core Level | | Memory Row/Column Redundancy | |
|---|---|---|---|
| | | No | Yes |
| Spare Core(s) | No | 0.77 | 0.84 |
| | Yes | 0.97 | 0.99 |

| Total Combined (Shell + Cores) | | Memory Row/Column Redundancy | |
|---|---|---|---|
| | | No | Yes |
| Spare Core(s) | No | 0.66 | 0.72 |
| | Yes | 0.83 | 0.84 |

Total Yields within ~1%

Fig. 3e

TECHNIQUES TO ACHIEVE AREA REDUCTION THROUGH CO-OPTIMIZING LOGIC CORE BLOCKS AND MEMORY REDUNDANCIES

FIELD OF THE DISCLOSURE

This disclosure relates generally to the design of semiconductor devices, and more particularly, to techniques for achieving area reduction through co-optimizing logic core blocks and memory redundancies, and structures resulting therefrom.

BACKGROUND

Embedded Static Random Access Memories (SRAMs) are commonly utilized as cache memory in semiconductor devices such as microprocessors, and as general purpose memory in application-specific integrated circuits (ICs). These devices receive significant performance enhancement by having embedded memory arrays, as opposed to utilizing external memory devices, but at an expense such as die space. A typical die, for instance, may be configured with many embedded SRAM arrays. It is not uncommon for these, and other types of memory arrays, to include millions of addressable storage cells (bits) organized into rows and columns. The number of bits in each array increases the chances of a defective bit, and thus, the potential of a die being rendered unusable after fabrication. For this reason, manufacturing guidelines state that redundancy should be built into each memory array in order to maintain acceptable yield. Redundancy is primarily accomplished through each array having some number of spare rows and columns to replace faulty ones. This type of redundancy is typically referred to as random access memory (RAM) redundancy or redundant memory. Memory redundancy tends to increase array size to account for the spares, which is particularly problematic when there are numerous or unusually small or fragmented memory arrays embedded within a die. In some cases, such as when there are unusually small and/or fragmented arrays, the amount of space needed to accommodate spares, and by extension maintain yield, can exceed available die space. This increase in array size, in turn, enhances the probability of defect. Thus there are numerous tradeoffs associated with providing adequate amounts of embedded memories to meet die performance requirements while keeping manufacturing costs low through maintaining an acceptable yield.

BRIEF DESCRIPTION OF THE DRAWINGS

FIG. 3a-3e show one example use case for determining a spare-core configuration in accordance with an embodiment of the present disclosure.

DETAILED DESCRIPTION

Figure 1:
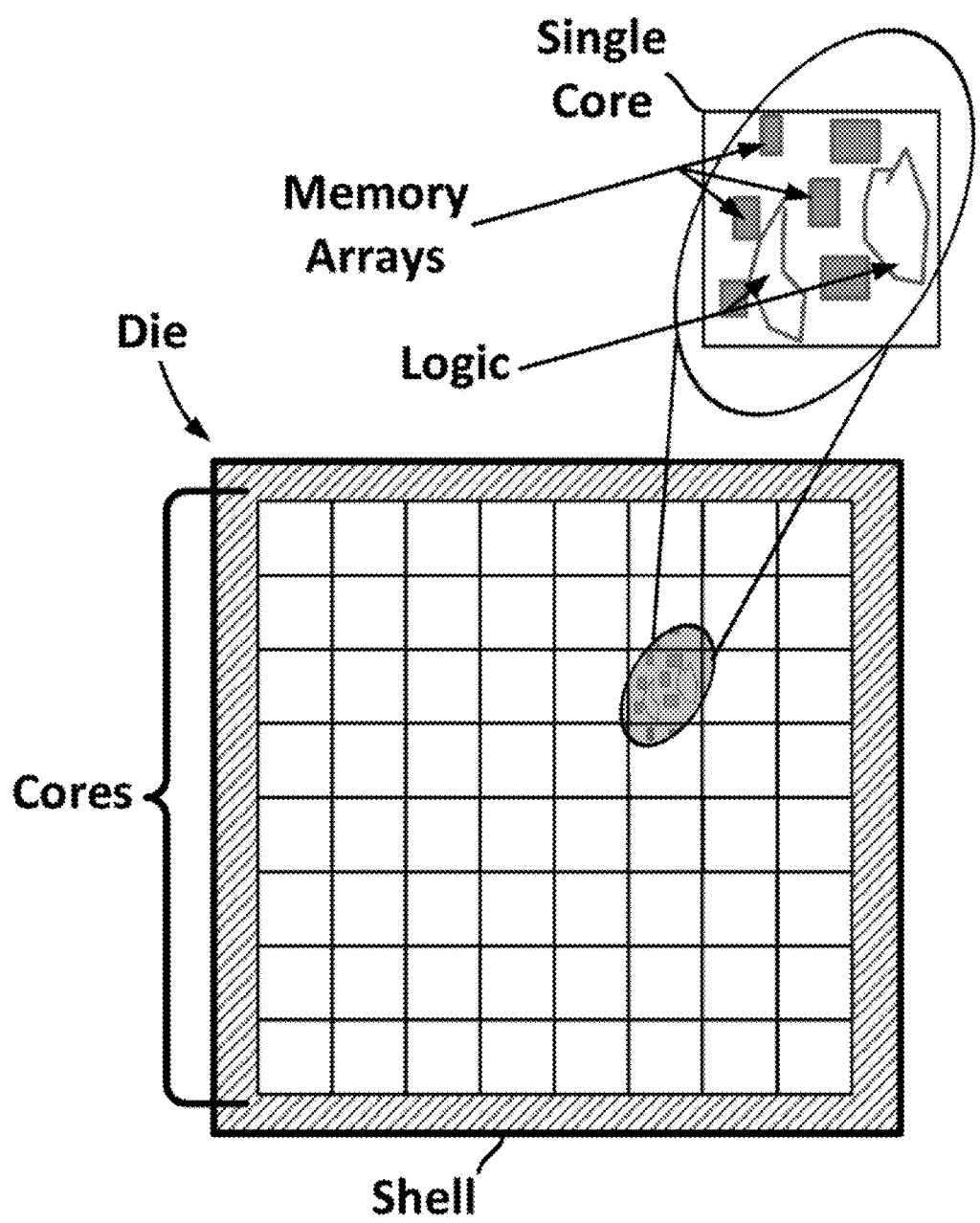
FIG. 1 shows an example semiconductor die configured in accordance with an embodiment of the present disclosure.

Techniques are disclosed for achieving size reduction of embedded memory arrays through determining a spare-core layout. More specifically, and in accordance with an embodiment, input parameters comprising global process parameters are combined with design characteristics to a compute a plurality of yield values corresponding to a variety of potential redundancy configurations for a die. In these embodiments, resulting yields may be compared to determine which redundancy configuration is suitable to maintain a particular yield. In some cases, it might be determined that a die configured with one or more spare cores (with no redundant memory therein) results in a yield which is equivalent to, or exceeds, the yield of a die with conventional memory redundancies in the cores, according to an embodiment. In these cases, it might be possible to eliminate memory redundancy from redundant cores in a die layout. By eliminating memory redundancies, each embedded memory array occupies only the amount of space necessary in a given core to accommodate non-redundant storage bits. These minimized memory arrays, in turn, result in collateral space-savings as other associated subcomponents (logic, fuses, etc.) may be minimized as well. The resulting benefit of such reduction in size can include a decrease in the rate of defects per die during fabrication, and thus, an increase in yield. The techniques may further be embodied in an integrated circuit structure. For instance, another embodiment provides a semiconductor device having embedded memory. The device includes an array of redundant cores, each core including a substantially identical composition of memory arrays and logic structures, wherein at least one of the memory arrays of each redundant core is implemented without at least one of row redundancy and column redundancy. Numerous variations and permutations will be further apparent in light of this disclosure.

General Overview

Current manufacturing guidelines state that each embedded memory array of a die should be configured with some number of spare rows and columns for redundancy purposes to maintain yield. This approach to redundancy uses a significant amount of space when a die includes thousands, or tens-of-thousands, of small embedded memory arrays. For example, consider that a manufacturer adopts a design rule to maintain an acceptable yield by stipulating that for every 1,000,000 bits (1 Mb) of storage in an array that five or six spare rows must be added to the array. Further, consider that the manufacturer also adopts a rule (in accordance with current manufacturing guidance) that requires that memory arrays smaller than 1 Mb also include some amount of redundancy. As should be appreciated, a die manufactured with numerous small memory arrays (<1 Mb) can result in a disproportionate amount of redundancy for these fragmented die. As a result, the amount of area required to add spares to each of the memory arrays is potentially very large and may exceed the available die area. In some applications, additional redundancy may be added in the form of core redundancy to further increase yield. In this approach, a die layout includes two or more cores with substantially identical composition including memory arrays, logic, and register files, etc. Having spare core(s) insures that if a defect occurs outside of a memory array, such as defect in logic structures, that the defect will not render the die unusable as the spare core can be used instead. Thus the inclusion of one or more spare cores can further increase yield. However, having memory redundancy, with or without the addition of core redundancy, results in a larger die than had no redundancy been included. A larger die will naturally have more defects than a smaller die, and thus, negatively impact yield. To this end, there is an increasing challenge to balance the need of having enough memories to meet performance requirements of ever-shrinking die while maintaining yield by including sufficient redundancies.

Thus, and in accordance with an embodiment of the present disclosure, techniques are provided for achieving size reduction of embedded arrays in a semiconductor device (microprocessors, field-programmable gate arrays (FPGAs), ICs, etc.) through determining a spare-core configuration which reduces or eliminates the necessity of memory row and column redundancies. In some embodiments, routines are disclosed which include a deterministic approach to selecting a redundancy configuration to achieve a particular yield. This approach should be recognized as a departure from current manufacturing guidelines which postulate that an acceptable yield is dependent on the inclusion of memory redundancies. In an embodiment, input parameters may be received which include global process parameters and design characteristic parameters. Global process parameters, as used herein, refer to a plurality of defect densities for each subcomponent (memory arrays, fuse, logic structures, etc.) relative to a redundancy configuration. Redundancy configurations might include, for instance, no redundancy, only row redundancy, only column redundancy, and both row and column redundancy. To this end, and in accordance with an embodiment, a defect density may be received which represents the probability of a defect per cm$^2$ for a subcomponent corresponding to each potential redundancy configuration. Design characteristics, as used herein, refer to the composition of redundant and non-redundant regions of a die. The composition of each region, in some embodiments, includes a percentage of each occupied by a given subcomponent. In an embodiment, a die includes an essential or "shell" region which includes memories and logic used to perform input/output operations with one or more cores. Such an arrangement is considered non-redundant as each die includes one essential region. Redundant regions, on the other hand, are regions which include redundant cores and potentially one or more spare cores, in accordance with an embodiment. In some embodiments, design scenarios varying in composition (design characteristics) and redundancy are input and used to calculate corresponding yields. In these embodiments, each design scenario operates on a presumption that each core includes substantially identical composition (e.g., embedded arrays, logic structures, register files, etc.). So, if each core is composed identically, the composition of a single core can be sufficient to determine an overall rate of defect for N number of cores which may be implemented within the redundant region. Thus, by varying composition and redundancy parameters, design scenarios including one or more spare core(s) (without redundant memory in the cores) can be input to generate prospective yields which then can be compared against yields resulting from design scenarios which implement conventional memory redundancy in the cores. In some cases, comparison might include generating a two-dimensional yield table which visually presents these yields. As will be appreciated by one having benefit of this disclosure, some embodiments disclosed herein demonstrate that conventional row and column redundancy or so-called memory redundancy can be entirely eliminated (e.g., reduction or elimination of both row and column redundancy) or partially (e.g., reduction or elimination of column redundancy), in some circumstances, because a design scenario including one or more spare cores is adequate to maintain or improve yield.

As will be appreciated, the phrasing 'substantially identical composition' as used herein with respect to redundant cores refers to a given function so as to provide redundancy of that function in the event that a given core fails to yield. It will be further appreciated that such redundancy can be provided without precise or otherwise exact identicalness of the redundant core structures. Rather, the structures may vary to some degree, so long as the specific function is associated with redundancy for purposes of enhancing yield. Any variance in structure may be unintentional (e.g., due to unintended process variations) or intentional (e.g., due to layout considerations). As also used herein, yield refers to the total number of functional die which may be produced from a single wafer of semiconductor material through fabrication processes such as photolithography. It should be appreciated that the techniques provided herein are compatible with various types of embedded memory arrays such as SRAM, dynamic random-access memory (DRAM), read-only memory (ROM), register files, and other types of memory that can be configured with no or lower row and column redundancy in conjunction with core redundancy. Of course, these memory arrays may then be incorporated into semiconductor devices such as microprocessors, field-programmable gate arrays, communication chip (e.g., for wireless communication), ICs, etc. As will be further appreciated, the techniques can be implemented, for example, as software applications or modules executable by one or more processors, and configured to compute an efficient wafer layout.

Example Yield Determination Techniques

Techniques and aspects provided herein for determining yields for a die based on redundancy configurations may be implemented and executed in various ways. For example, some embodiments may be implemented as routines in source code (C++, C#, Python, Perl, etc.) which might be compiled/interpreted into executable code. In some cases, the executable code is consumed in a stand-alone application, or as a "plug-in" tool to aid die design performed in a commercially available semiconductor architecture design application. In other cases, routines disclosed herein can be implemented in a spreadsheet application, such as Microsoft® Excel™, and comprise cell-based algorithms which can be executed against datasets containing input parameters (global process parameters, design characteristics, etc.). In any such cases, routines may be implemented within a computer application and executed by, for example, the computing system 400 of FIG. 4. In an embodiment, the executed computer application includes one or more custom user interface (UI) screens configured to accept user input in order to receive and manipulate global process parameters and design characteristics, as well as execute yield determination routines variously provided herein. For example, the custom UI screens might comprise an Excel™ spreadsheet configured to receive input parameters into formatted tables and present resulting yield scenarios in a visualized table and/or graph.

The following description of routines, calculations, and examples provided herein might be more easily understood by visualizing the composition of one example die. FIG. 1 illustrates one such example die, in accordance with an embodiment. As shown, the die includes a shell (essential) region and an array of redundant core blocks (cores). Each core includes an identical composition of memory arrays and logic structures in this example configuration. As will be appreciated in light of this disclosure, at least one of the memory arrays (or some or all the memory arrays) of each redundant core can be implemented without redundancy (e.g., without row redundancy, without column redundancy, or without both row and column redundancy), in accordance with an embodiment. It should be appreciated that each core might comprise, for example, a complete microprocessor or other functional circuit, or part of such a functional circuit. Further, it should be appreciated that the die illustrated in FIG. 1 has been simplified for clarity and might include numerous other configurations, compositions, and subcomponents normally included in semiconductor devices (e.g., RFs, fuses, anti-fuses, transistors, resistors, capacitors, conductive runs, etc.). Although method 200 of FIG. 2 and the die shown in FIG. 1 are depicted and described in the context of a single array of cores, similar principles and techniques as variously provided herein may be used in conjunction with other die configurations including, for example, dies configured with multiple arrays of cores. In some cases, each array of cores might include identical cores therein, but with differing core-composition within each core array.

Figure 2:
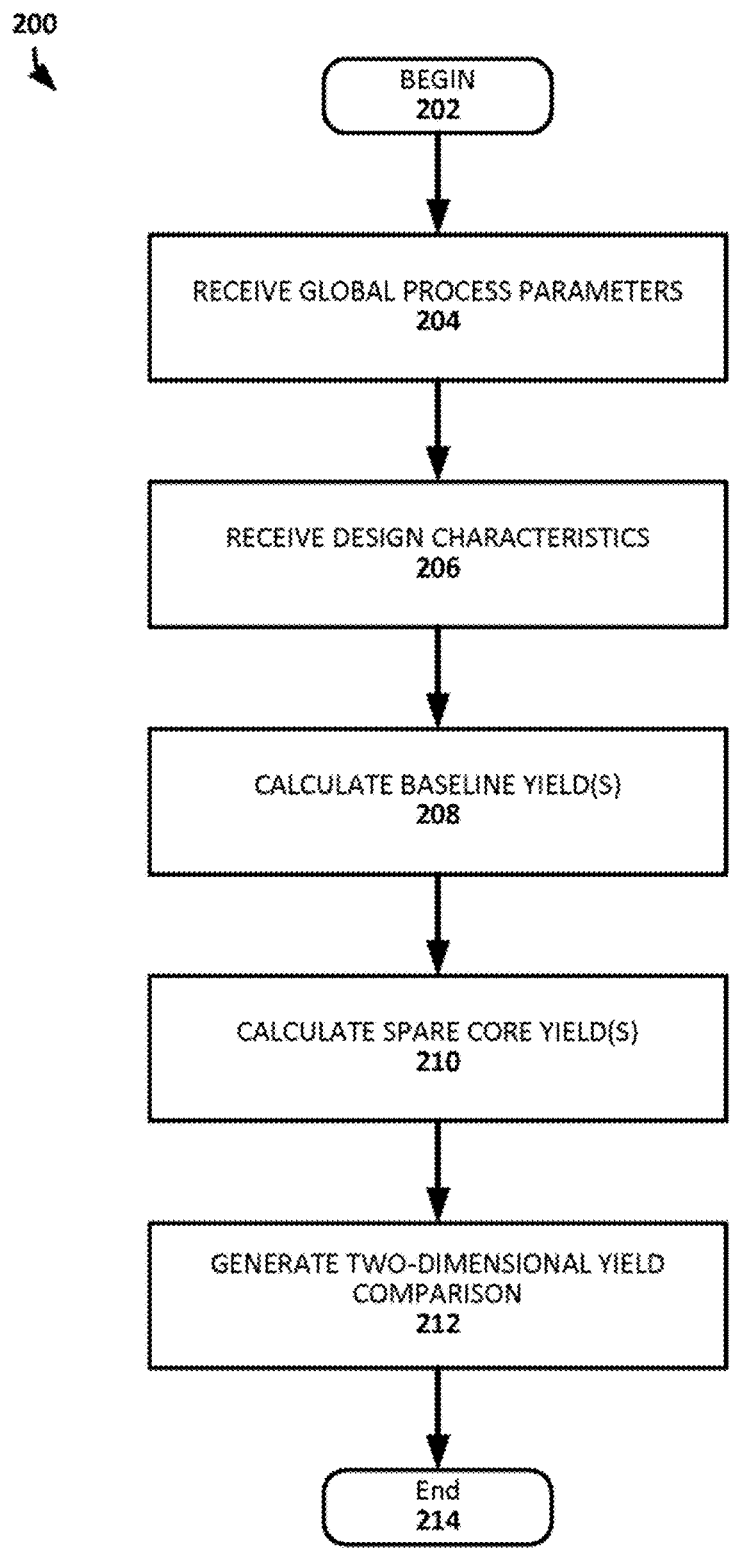
FIG. 2 shows method of calculating yields for a die based on global process parameters and design characteristics in order to determine and validate a spare-core configuration in accordance with an embodiment of the present disclosure.

FIG. 2 shows method of calculating yields for a die based on global process parameters and design characteristics in order to determine and validate a spare-core configuration in accordance with an embodiment. Although embodiments discussed below include specific examples of subcomponents such as logic structures, memory arrays (RAMs), and register files (RFs), the provided techniques are not so limited. For example, any subcomponent with a quantifiable defect density may be included and factored into various calculations disclosed herein. Method 200 comprises acts of receiving global process parameters, receiving design characteristics, calculating baseline yields, calculating spare-core yields, and generating a two-dimensional yield comparison. The method 200 begins in act 202.

In act 204, global process parameters are received from, for example, user input via editable regions of a user interface and stored for subsequent yield calculations. In other cases, global process parameters may be retrieved from a database or flat file. In still other cases, global process parameters may be received through calls to an application programming interface (API) of a commercially available semiconductor architecture design application. In an embodiment, the global process parameters comprise defect densities corresponding to each subcomponent (logic structures, RAM arrays, RFs, etc.). The defect densities represent the average probability of an unrecoverable defect occurring (e.g., per cm²) relative to memory redundancy configurations. Memory redundancy configurations can include, for example, no redundancy, only row redundancy, only column redundancy, or both row and column redundancy. It should be noted that having some form of redundancy in the form of row and/or column redundancy should reduce each corresponding defect density. Some structures, however, do not utilize these memory redundancies (such as logic structures, fuses, etc.) and will be represented by a single defect density within the global process parameters. This is not particularly relevant to the yield calculations discussed below, but the defect density of these structures generally does not warrant additional concern as their defect densities are relatively low as compared to other structures (RAM arrays, RFs, etc.).

In act 206, design characteristics are received from, for example, user input via editable regions of a user interface and stored for subsequent yield calculations. In other cases, the design characteristics may be retrieved from a database or flat file. In still other cases, the design characteristics may be received through calls to an application programming interface (API) of a commercially available semiconductor architecture design application in order to import the design characteristics from an existing die design. In these cases, a die, such as the example die depicted in FIG. 1, may have previously undergone a pre-fabrication design and modeled in the design application. In an embodiment, the design characteristics define the composition of the non-redundant shell region and the composition of a single core region in respect to the various redundancy configurations discussed above. More particularly, the composition can include the total area (e.g., in cm²) for each of the shell region and the single core region, and percentages corresponding to the subcomponent composition therein. For instance, for the single core region the amount of core space each type of subcomponent (e.g., RAM, RF, etc.) occupies in the single core region can be represented by a percentage. As should be appreciated, the amount of space a memory array occupies is a sum of the initial array size plus the space to accommodate redundant memory (if any). Accordingly, designs with some amount of memory redundancies will naturally result in larger memory arrays, and thus, can increase the total size of a single core region to accommodate the redundancies. As discussed below, and in accordance with an embodiment, only a single core may be necessary to calculate composition for an entire array of redundant N cores as each core is configured identically.

In act 208, a baseline yield for a die with conventional memory redundancies is calculated based on the received global process parameters and the received design characteristics. To determine the baseline yield, and in accordance with an embodiment, a weighted defect probability is first calculated for each subcomponent of the shell region and the single core region based on the composition therein. In this embodiment, the weighted defect probability for each subcomponent may be calculated as:

$$r = A_{region} \times c_{sub} \times d_{sub} \qquad \text{Equation (1)}$$

where (r) is the weighted defect probability for a subcomponent, ($A_{region}$) is the total area of a region defined by the design characteristics, ($c_{sub}$) is the percentage of the region the subcomponent occupies defined by the design characteristics, and ($d_{sub}$) is the defect density for the subcomponent as defined in the global process parameters. Thus, a yield for each of the shell region and the single core region may be calculated using a Poisson distribution function:

$$Y = e^{(-r)} \qquad \text{Equation (2)}$$

where (Y) is the yield, and $e^{(-r)}$ represents multiplication of the exponents of each subcomponent's weighted defect probability. Thus to determine the resulting yield for a configuration including a number of redundant cores and spare cores a binomial distribution function utilizing the result of Equation (2) for the single core region may be utilized:

$$Y = nCr \times p^{(n-r)} \times (1-p)^r \qquad \text{Equation (3)}$$

where (Y) is the yield, (n) is the number of redundant cores, (r) is the number of spare cores, (p) is the yield of the single core region as calculated in Equation (2), and (nCr) is the combinatorial term defined as:

$$nCr = \frac{n!}{((r!) \times (n-r)!)} \qquad \text{Equation (4)}$$

Therefore, a baseline yield value may be determined based on adjusting design characteristics including composition, memory redundancies, and spare core(s), in an embodiment. As discussed further below, this baseline yield value represents yield expectations for a conventional layout (e.g., cores including memory redundancies). It should be appreciated that while this disclosure includes the use of probability functions such as Poisson distribution functions and binomial distribution functions, this disclosure is not so limited. Other probability functions may be utilized such as empirical functions especially in the case of defect dependence or sequential dependence.

In act 210, one or more spare-core yields are calculated based on the global process parameters received in act 204 and various design characteristics defining potential spare-core configurations (that exclude/minimize redundant memory in the cores). In an embodiment, the design characteristics may be received via user-input, for example, to define the composition values for the single core region in order to compute yields for a layout with one or more spare cores. So, the various spare core configurations include the shell region potentially having some memory redundancies while the single core region has little to no memory redundancies, according to an embodiment. Instead, varying numbers of spare cores can be factored into Equations (2)-(4) discussed above to produce yields for comparison and validation against the baseline yields calculated in act 208.

In act 212, a two-dimensional yield comparison is generated based on the baseline yield values calculated in act 208 and the spare-core configuration yield values calculated in act 210. In an embodiment, the two-dimensional yield may be visualized, for instance, as a table or graph in order to enable a user to compare relative yields. In some cases, the yield values for spare-core configurations are within an acceptable tolerance (1%, 2%, %5, etc.) of the base-line yields. As should be appreciated by one having the benefit of this disclosure, such yield results demonstrate that memory redundancies might be eliminated through spare-core redundancy without having a substantial impact on yield. Further, it should be appreciated that elimination of memory redundancies reduces the size of embedded arrays and, in turn, can enable smaller die as the space-savings is multiplied by the number of cores. In an embodiment, a die area reduction percentage may be derived from the calculated space-savings. For example, the die area reduction percentage may be calculated by taking the total area necessary to fabricate the die including memory redundancies in the redundant cores minus the total area necessary to fabricate the die excluding memory redundancies in the redundant cores. In some embodiments, the die area reduction percentage may then be used to determine an additional yield value for inclusion in the two-dimensional yield comparison that can reflect the "true" yield of a die which accounts for area reduction gained through minimizing memory redundancies in the redundant cores. So, in some embodiments, a second-order effect of such a size reduction can be understood as a non-linear increase in yield as the number of die-per-wafer is greater than had the die been sized to accommodate memory redundancies. Thus, in accordance with an embodiment, the yield of a die designed with a spare-core configuration might ultimately reduce cost by substantially exceeding the yield of a similar die manufactured with conventional memory redundancies.

Example Usage Scenario

Figure 3D:
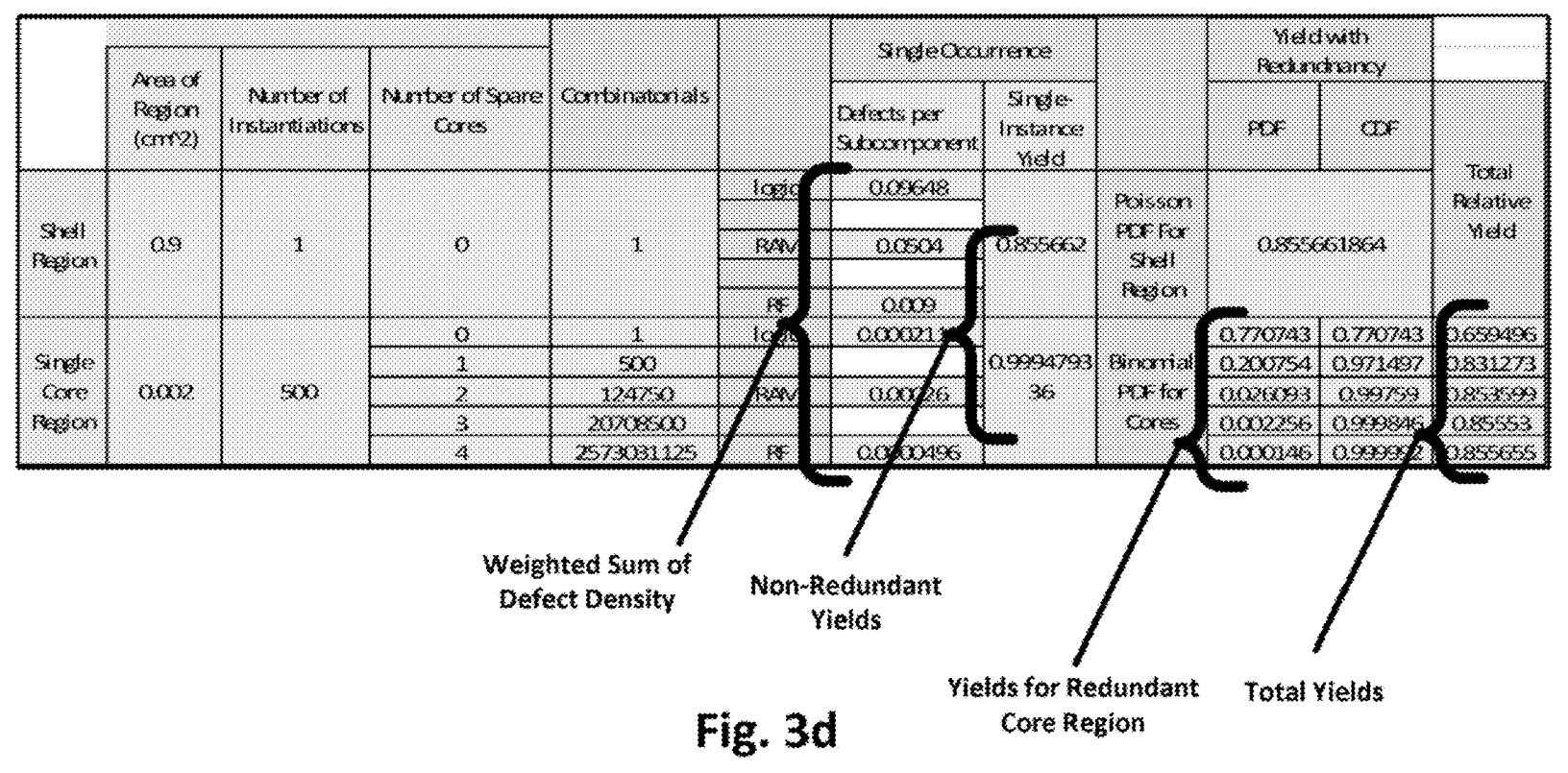

The method 200 of FIG. 2 and the various techniques and embodiments may be further understood by way of example. FIGS. 3a-3e with further reference to FIG. 2 illustrate one such example. Referring to FIG. 3a, one example of a global process parameter table is depicted with subcomponent defect densities corresponding to memory redundancy configurations. As discussed in act 204 of FIG. 2, the global process parameters might have been received through user input, or perhaps retrieved from a database. As shown, the average defect density is a function of complexity of the subcomponents. For example, logic structures are relatively simple and have a lower chance of defect as compared to more complex subcomponents such as memory arrays.

Referring to FIG. 3b, a design characteristics table is depicted with shell and single core region compositions. As discussed in act 206 of FIG. 2, the design characteristics may be received by way of user input, database retrieval, or API access, for example. As shown, the design characteristics table is divided into two categories of composition, namely the composition of the shell region and of the single core region. Each region is then separated into subcomponents, such as logic, RAM, and RF, with corresponding composition percentages outlined by a dashed line. These composition percentages may be modified by user input, for example, in order to evaluate yields based on different compositions in accordance with some embodiments disclosed herein. As shown, the shell region is defined as an area of 0.9 $cm^2$ with 28% of the region being RAM arrays and 5% being RFs. It should be noted that the example shell region is set to a "never bare" redundancy configuration of 100%, which means that each and every bit of the memory arrays configured in the shell region have a spare. Similarly, the single core region is set to a configuration of 100% row and column redundancy and is defined as an area of 0.002 $cm^2$ with 26% of the area being RAM arrays and 8% being RFs. As discussed above, the composition of a single core region can be sufficient to determine a yield for N redundant cores as each core is identically configured with the same composition.

FIG. 3c depicts example baseline yield results based on the values entered into the global process parameters table of FIG. 3a and the design characteristics table of FIG. 3b. As shown, a weighted defect probability (or defect average) for each subcomponent was calculated using Equation (1). Using Equation (2) and the per-subcomponent defect averages, non-redundant yield values for each of the shell and single core regions was calculated. It should be understood that non-redundant yield refers to a yield which does not factor in the number of defined redundant cores (e.g., 500 as shown under the "number of instantiations" column heading). Using the binomial distribution function of Equation (3) and the combinatorial term as defined in Equation (4), yields were calculated based on 500 redundant cores with varying numbers of spare cores (0 to 4). As shown, yield results for redundant core region (e.g., the region including the 500 redundant cores) appear in three columns. The first left-most column represents incremental results starting from a baseline configuration of 0 spare cores (0.84) up to 4 spare cores (3.15E-05). In this particular example, the incremental change (or benefit in yield) diminishes greatly after the first spare core is added. The middle column shows the corresponding yield for the redundant core region based on the incremental changes. The right-most column demonstrates an overall (total) yield based on the combined shell and the core region (e.g., the entire die) relative to the number of spares. As shown, a baseline yield of approximately 0.72 will occur which translates to a loss of 28%, or stated differently, 28 of every 100 die produced is expected to be defective. A single spare core increases the yield incrementally by 0.145959 to 0.844, or to a loss of only 16.4%. This difference in yield is substantial and underscores the benefits of including a spare core in addition to conventional memory redundancies. Beyond the first spare core, each spare core added thereafter results in a small incremental change in yield.

FIG. 3d depicts spare-core configuration yield results similar to those of FIG. 3c but based on design characteristics including a composition without memory redundancies in the single core region. For example, a table similar to the design characteristics table of FIG. 3b may be utilized to receive input from user-input, for example, to determine yields for configurations utilizing spare-cores exclusively. In particular, the "row and column redundancy" values can be set to 0% for the single core region, and instead the "no row or column redundancy" values can be set to 100%. It should be noted that values pertaining to the shell region can be the same as the values appearing in FIG. 3b with a configuration including 100% row and column redundancy. As shown, the per-subcomponent weighted defect averages remain identical (as the global process parameters of FIG. 3a have not changed). As discussed in act 210 of FIG. 2, Equations (1)-(4) may be utilized to calculate the resulting yields. Resulting non-redundant yields are substantially similar to that of the baseline yield results of FIG. 3b, with the exception being that the single core region has a marginally worse yield due to having a configuration without redundant memory. As shown by the yields of the redundant core region, the total yield for 500 cores with no spare cores and no memory redundancy therein is 0.66, or a loss of 34%. However, including just one spare core, as shown by the total resulting yield, brings the yield to 0.831, or loss of only 17.9%.

Referring now to FIG. 3e, a two-dimensional comparison is depicted illustrating the yield results of various redundancy configurations in the core region and in the combined core and shell region. In this example, the resulting yields from the baseline and spare-core configurations, such as computed by acts 208 and 210 of FIG. 2, respectively, appear in two tables. The top table depicts yields pertaining to just the single core region and the bottom table for the yields pertaining to the total combined shell region and redundant core region. Each of these tables are divided into four quadrants which correspond to yields based on a redundancy configuration of: no spare cores with no memory redundancy, no spare cores with 100% memory redundancy, one spare core with no memory redundancy, and one spare core with 100% memory redundancy. Current manufacturing guidelines would suggest that by not having memory redundancies a low and unacceptable yield occurs. Non-intuitively, as shown in the two-dimensional yield comparison, having a redundancy configuration with a single spare core, and no memory redundancy therein, results in a total yield that is within 1% of the baseline yield for a redundancy configuration which includes 100% memory redundancy in the cores. As shown, the two-dimensional comparison of FIG. 3e highlights that memory redundancies are unnecessarily occupying space when a spare core is sufficient to maintain an acceptable yield. However, this surprisingly minor difference in yields does not reflect certain second-order benefits of eliminating memory redundancies. For instance, it should be appreciated that because memory redundancies can be eliminated based on validation of a spare-core configuration by routines variously provided herein, a die can ultimately be smaller as each redundant core does not include spare rows and/or columns in each embedded memory array. As discussed above, the space-savings can be converted into a percentage of die area reduction. For example, consider a die with 100% memory redundancies in each redundant core requires a total die area equal to 1.902 cm$^2$ (shell area+total redundant core area). An equivalent total area for the die without such memory redundancies, for example, might be 1.501 cm$^2$ as the total redundant core area necessary to fabricate the die is reduced by 50%. To this end, an overall die area reduction of 11%, as is the case in this example, would lead to a yield greater than the 0.831 shown in the two-dimensional yield of FIG. 3e. Thus the overall die area reduction results in a non-linear increase in yield as a greater number of die can be produced from a single wafer. Although not shown in FIG. 3e, this "true" yield achieved through area reduction in each redundant core may be displayed along with other yield results in the two-dimensional comparison in order to assist in interpreting relative results. So, it should be understood that various techniques provided herein demonstrate that yields of a die with a spare-core configuration can be calculated and presented to a user in order to compare other potential die redundancy configurations, including configurations utilizing some amount of conventional memory redundancies. In some cases a user can make a decision to increase, or decrease, memory redundancy not based on binary manufacturing rule, but instead based on determinations based on techniques and aspects variously provided herein.

Example System

Figure 4:
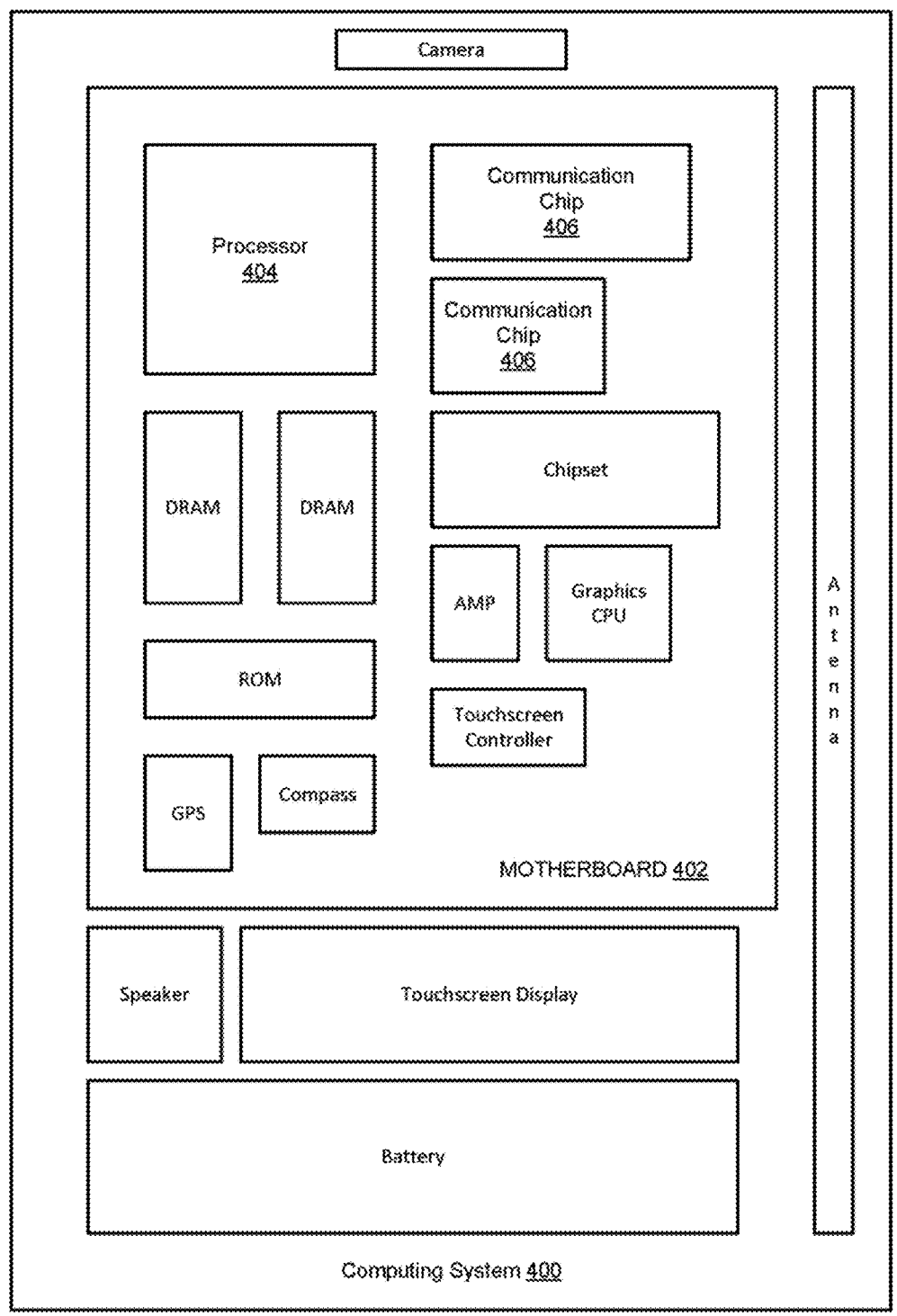
FIG. 4 illustrates a computing system configured to execute routines for determining yields based on various die redundancy configurations in accordance with techniques and aspects provided in the present disclosure.

FIG. 4 illustrates a computing system configured to execute routines for determining yields based on various die redundancy configurations in accordance with techniques and aspects provided in the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc. Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices formed using the techniques disclosed herein. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or implements one or more routines, as variously described herein.

Further Example Embodiments

The following examples pertain to further embodiments, from which numerous permutations and configurations will be apparent.

Example 1 is a system comprising: a memory; and a processor coupled to the memory and configured to: receive global process parameters, the global process parameters including at least one subcomponent and corresponding defect density; receive design characteristics, the design characteristics including a die composition based on a redundancy configuration and the at least one subcomponent; and calculate one or more yields value based on the global process parameters and the design characteristics.

Example 2 includes the subject matter of Example 1, wherein the one or more yield values are based on the die composition including one or more spare cores and no redundant memory in a redundant core region of the die.

Example 3 includes the subject matter of Example 1 or 2, wherein the die composition defines a redundant core region with N redundant cores and the one or more yield values are a plurality of yield values including a first and second yield value, and wherein the processor is configured to: determine the first yield value based on each redundant core being configured with a first percentage of redundant memory; determine the second yield value based one or more cores of the N redundant cores configured as a spare core, wherein each redundant core is configured with a second percentage of redundant memory less than the first percentage of redundant memory; and compare the first yield value to the second yield value to determine whether the first yield value and the second yield value are within a predefined tolerance.

Example 4 includes the subject matter of Example 3, wherein the processor is further configured to determine a die area reduction percentage based on a difference between the area required to fabricate a die having a composition including the first percentage of redundant memory and the area required to fabricate a die having a composition including the second percentage of redundant memory.

Example 5 includes the subject matter of Example 3 or 4, wherein the first and second yield values are based on output of a binomial distribution function, the binomial distribution function being configured to determine a yield for the N redundant cores based on a calculated yield for a single redundant core.

Example 6 includes the subject matter of Example 5, wherein the calculated yield of the single redundant core is based on output of a Poisson distribution function.

Example 7 includes the subject matter of any of Examples 3-6, wherein the predefined tolerance is a range between 1% and 5%.

Example 8 includes the subject matter of any of Examples 3-7, wherein the processor is further configured to generate a two-dimensional yield comparison comprising the first yield value and the second yield value.

Example 9 includes the subject matter of Example 8, wherein the two-dimensional yield comparison is at least one of a table and a graph.

Example 10 includes the subject matter of Example 8 or 9, wherein the two-dimensional yield comparison includes a third yield based on a die area reduction percentage.

Example 11 includes the subject matter of any of Examples 1-10, wherein the at least one subcomponent is at least one of a memory array, a fuse, a logic structure, and a register file.

Example 12 includes the subject matter of any of Examples 1-11, wherein the defect densities included in the global process parameters for the at least one subcomponent correspond to a plurality of redundancy configurations.

Example 13 includes the subject matter of Example 12, wherein the plurality of redundancy configurations includes at least one of a no redundancy configuration, a row redundancy configuration, a column redundancy configuration, and a row and column redundancy configuration.

Example 14 includes the subject matter of any of Examples 1-13, wherein the global process parameters and the design characteristics are received from at least one of user-input, a database, and an application programming interface.

Example 15 includes a mobile computing device comprising the system of any of Examples 1-14.

Example 16 includes a method of determining potential yields for a die, the method comprising: receiving global process parameters, the global process parameters including at least one subcomponent and corresponding defect density; receiving design characteristics, the design characteristics including a die composition based on a redundancy configuration and the at least one subcomponent; and calculating one or more yield values based on the global process parameters and the design characteristics.

Example 17 includes the subject matter of Example 16, wherein the one or more yield values are based on the die composition including at least one spare core and no redundant memory in a redundant core region of the die.

Example 18 includes the subject matter of Example 16 or 17, wherein the die composition defines a redundant core region with N redundant cores and the one or more yield values are a plurality of yield values including a first and second yield value, and wherein calculating the one or more yield values further comprises: determining the first yield value based on each redundant core being configured with a first percentage of redundant memory; determining the second yield value based on at least one core of the N redundant cores configured as a spare core, each redundant core being configured with a second percentage of redundant memory less than the first percentage; and comparing the first yield value to the second yield value to determine whether the first yield value and the second yield value are within a predefined tolerance.

Example 19 includes the subject matter of Example 18, wherein the method further comprises determining a die area reduction percentage based on a difference between the area required to fabricate a die having a composition including the first percentage of redundant memory and the area required to fabricate a die having a composition including the second percentage of redundant memory.

Example 20 includes the subject matter of Example 18 or 19, wherein the first and second yield values are based on output of a binomial distribution function, the binomial distribution function being configured to determine a yield for the N redundant cores based on a calculated yield for a single redundant core.

Example 21 includes the subject matter of Example 20, wherein the yield of the single redundant core is based on output of a Poisson distribution function.

Example 22 includes the subject matter of any of Examples 18-21, wherein the predefined tolerance is a range between 1% and 5%.

Example 23 includes the subject matter of any of Examples 18-22, wherein the method further comprises generating a two-dimensional yield comparison comprising the first yield value and the second yield value.

Example 24 includes the subject matter of Example 23, wherein the two-dimensional yield comparison is visualized as at least one of a table and a graph.

Example 25 includes the subject matter of Example 23 or 24, wherein the two-dimensional yield comparison includes a third yield based on a die area reduction percentage.

Example 26 includes the subject matter of any of Examples 16-25, wherein the at least one subcomponent is at least one of a memory array, a fuse, a logic structure, and a register file.

Example 27 includes the subject matter of any of Examples 16-26, wherein the defect densities included in the global process parameters for the at least one subcomponent correspond to a plurality of redundancy configurations.

Example 28 includes the subject matter of Example 27, wherein the plurality of redundancy configurations includes at least one of a no redundancy configuration, a row redundancy configuration, a column redundancy configuration, and a row and column redundancy configuration.

Example 29 includes the subject matter of any of Examples 16-28, wherein the global process parameters and the design characteristics are received from at least one of user-input via a user interface, a database, and an application programming interface.

Example 30 includes a computer program product comprising a plurality of instructions non-transiently encoded thereon that when executed cause a processor to: receive global process parameters, the global process parameters including at least one subcomponent and corresponding defect density; receive design characteristics, the design characteristics including a die composition based on a redundancy configuration and the at least one subcomponent; and calculate one or more yield values based on the global process parameters and the design characteristics.

Example 31 includes the subject matter of Example 30, wherein the one or more yield values are based on the die composition including at least one spare core and no redundant memory in a redundant core region of the die.

Example 32 includes the subject matter of Example 30 or 31, wherein the die composition defines a redundant core region with N redundant cores and the one or more yield values are a plurality of yield values including a first and second yield value, and wherein the instructions cause the processor to: determine the first yield value based on each redundant core being configured with a first percentage of redundant memory; determine the second yield value based on at least one core of the N redundant cores configured as a spare core, wherein each redundant is core configured with a second percentage of redundant memory less than the first percentage of redundant memory; and compare the first yield value to the second yield value to determine whether the first yield value and the second yield value are within a predefined tolerance.

Example 33 includes the subject matter Example 32, wherein the instructions further cause the processor to determine a die area reduction percentage based on a difference between the area required to fabricate a die having a composition including the first percentage of redundant memory and the area required to fabricate a die having a composition including the second percentage of redundant memory.

Example 34 includes the subject matter of Example 32 or 33, wherein the first and second yield values are based on output of a binomial distribution function, the binomial distribution function being configured to determine a yield for the N redundant cores based on a calculated yield for a single redundant core.

Example 35 includes the subject matter of Example 34, wherein the yield of a single redundant core is based on output of a Poisson distribution function.

Example 36 includes the subject matter of any of Examples 32-35, wherein the predefined tolerance is a range between 1% and 5%.

Example 37 includes the subject matter of any of Examples 32-36, wherein the instructions further cause the processor to generate a two-dimensional yield comparison comprising the first yield value and the second yield value.

Example 38 includes the subject matter of Example 37, wherein the two-dimensional yield comparison is at least one of a table and a graph.

Example 39 includes the subject matter of Example 37 or 38, wherein the two-dimensional yield comparison includes a third yield based on a die area reduction percentage.

Example 40 includes the subject matter of any of Examples 30-39, wherein the at least one subcomponent is at least one of a memory array, a fuse, a logic structure, and a register file.

Example 41 includes the subject matter of any of Examples 30-40, wherein the defect densities included in the global process parameters for the at least one subcomponent correspond to a plurality of redundancy configurations.

Example 42 includes the subject matter of Example 41, wherein the plurality of redundancy configurations includes at least one of a no redundancy configuration, a row redundancy configuration, a column redundancy configuration, and a row and column redundancy configuration.

Example 43 includes the subject matter of any of Examples 30-42, wherein the global process parameters and the design characteristics are received from at least one of user-input, a database, and an application programming interface.

Example 44 includes a plugin-tool compatible with a commercial semiconductor architecture design application comprising the computer program of any of Examples 30-43.

Example 45 includes a semiconductor device having embedded memory, the device comprising: an array of redundant cores, each core including a substantially identical composition of memory arrays and logic structures, wherein at least one of the memory arrays of each redundant core is implemented without at least one of row redundancy and column redundancy.

Example 46 includes the subject matter of Example 45, wherein each of the memory arrays of each redundant core is implemented without at least one of row redundancy and column redundancy.

Example 47 includes the subject matter of Example 45, wherein each of a plurality of the memory arrays of each redundant core is implemented without at least one of row redundancy and column redundancy.

Example 48 includes the subject matter of any of Examples 45-47, wherein each of the memory arrays implemented without at least one of row redundancy and column redundancy is implemented without column redundancy.

Example 49 includes the subject matter of any of Examples 45-48, wherein each of the memory arrays implemented without at least one of row redundancy and column redundancy is implemented without row redundancy.

Example 50 includes the subject matter of any of Examples 45-49, wherein each redundant core comprises a microprocessor.

Example 51 includes the subject matter of any of Examples 45-50, wherein each redundant core comprises a field-programmable gate array (FPGA).

Example 52 includes the subject matter of any of Examples 45-51, wherein each redundant core comprises part of a functional circuit.

Example 53 includes the subject matter of any of Examples 45-52, wherein the device is a microprocessor.

Example 54 includes the subject matter of any of Examples 45-52, wherein the device is a field-programmable gate array (FPGA).

Example 55 includes the subject matter of any of Examples 45-52, wherein the device is a wireless communication chip.

Example 56 includes the subject matter of any of Examples 45-55, wherein the memory arrays comprise random access memory (RAM).

Example 57 includes the subject matter of any of Examples 45-56, wherein the memory arrays comprise at least one of static random access memory (SRAM) and dynamic random access memory (DRAM).

Example 58 includes the subject matter of any of Examples 45-57, wherein the memory arrays comprise register files.

Example 59 includes a mobile computing device comprising the semiconductor device of any of Examples 45-58. The mobile computing device may be, for example, a laptop or smart phone or tablet.

What is claimed is:

1. A system for die yield determination, the system comprising:
    a memory;
    a processor coupled to the memory and configured to:
        receive global process parameters, the global process parameters including at least one subcomponent and corresponding defect density;
        receive design characteristics, the design characteristics including a die composition based on a redundancy configuration and the at least one subcomponent; and
        calculate one or more yields values based on the global process parameters and the design characteristics;
        wherein the one or more yield values are based on the die composition including one or more spare cores and no redundant memory in a redundant core region of the die, and
        wherein a die is fabricated based on the one or more yield values.

2. The system of claim 1, wherein the die composition defines a redundant core region with N redundant cores and the one or more yield values are a plurality of yield values including a first and second yield value, and wherein the processor is configured to:
    determine the first yield value based on each redundant core being configured with a first percentage of redundant memory;
    determine the second yield value based one or more cores of the N redundant cores configured as a spare core, wherein each redundant core is configured with a second percentage of redundant memory less than the first percentage of redundant memory; and
    compare the first yield value to the second yield value to determine whether the first yield value and the second yield value are within a predefined tolerance;
    wherein the processor is further configured to determine a die area reduction percentage based on a difference between the area required to fabricate a die having a composition including the first percentage of redundant memory and the area required to fabricate a die having a composition including the second percentage of redundant memory.

3. A computer program product comprising a plurality of instructions non-transiently encoded thereon that when executed by one or more processors cause a process to be carried out for determining die yields, the process comprising:
    receive global process parameters, the global process parameters including at least one subcomponent and corresponding defect density;
    receive design characteristics, the design characteristics including a die composition based on a redundancy configuration and the at least one subcomponent; and
    calculate one or more yield values based on the global process parameters and the design characteristics;
    wherein the one or more yield values are based on the die composition including at least one spare core and no redundant memory in a redundant core region of the die, and
    wherein a die is fabricated based on the one or more yield values.

4. The computer program of claim 3, wherein the die composition defines a redundant core region with N redundant cores and the one or more yield values are a plurality of yield values including a first and second yield value, and wherein the instructions cause the processor to:
    determine the first yield value based on each redundant core being configured with a first percentage of redundant memory;
    determine the second yield value based on at least one core of the N redundant cores configured as a spare core, wherein each redundant is core configured with a second percentage of redundant memory less than the first percentage of redundant memory; and
    compare the first yield value to the second yield value to determine whether the first yield value and the second yield value are within a predefined tolerance;
    wherein the instructions further cause the processor to determine a die area reduction percentage based on a difference between the area required to fabricate a die having a composition including the first percentage of redundant memory and the area required to fabricate a die having a composition including the second percentage of redundant memory.

5. The computer program of claim 3, wherein the instructions further cause the processor to generate a two-dimensional yield comparison comprising the first yield value and the second yield value.

6. A method of determining potential yields for a die, the method comprising:
- receiving global process parameters, the global process parameters including at least one subcomponent and corresponding defect density;
- receiving design characteristics, the design characteristics including a die composition based on a redundancy configuration and the at least one subcomponent;
- calculating one or more yields value based on the global process parameters and the design characteristics; and
- fabricating a die based on the one or more yield values;
- wherein the one or more yield values are based on the die composition including one or more spare cores and no redundant memory in a redundant core region of the die.

7. The method of claim 6, wherein the die composition defines a redundant core region with N redundant cores and the one or more yield values are a plurality of yield values including a first and second yield value, the method further comprising:
- determining the first yield value based on each redundant core being configured with a first percentage of redundant memory;
- determining the second yield value based one or more cores of the N redundant cores configured as a spare core, wherein each redundant core is configured with a second percentage of redundant memory less than the first percentage of redundant memory;
- comparing the first yield value to the second yield value to determine whether the first yield value and the second yield value are within a predefined tolerance; and
- determining a die area reduction percentage based on a difference between the area required to fabricate a die having a composition including the first percentage of redundant memory and the area required to fabricate a die having a composition including the second percentage of redundant memory.

8. The method of claim 7, further comprising generating a two-dimensional yield comparison comprising the first yield value and the second yield value.

* * * * *